US009978607B2

(12) United States Patent
Lin et al.

(10) Patent No.: US 9,978,607 B2
(45) Date of Patent: May 22, 2018

(54) THROUGH VIA STRUCTURE AND METHOD

(71) Applicant: Taiwan Semiconductor Manufacturing Company, Ltd., Hsin-Chu (TW)

(72) Inventors: Yung-Chi Lin, Su-Lin (TW); Hung-Pin Chang, Taipei (TW); Tsang-Jiuh Wu, Hsin-Chu (TW); Wen-Chih Chiou, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

(21) Appl. No.: 14/478,391

(22) Filed: Sep. 5, 2014

(65) Prior Publication Data

US 2016/0071765 A1 Mar. 10, 2016

(51) Int. Cl.
| | |
|---|---|
| *H01L 21/768* | (2006.01) |
| *H01L 21/306* | (2006.01) |
| *H01L 21/308* | (2006.01) |
| *H01L 27/088* | (2006.01) |
| *H01L 29/78* | (2006.01) |
| *H01L 23/48* | (2006.01) |

(52) U.S. Cl.
CPC .... *H01L 21/3083* (2013.01); *H01L 21/76898* (2013.01); *H01L 23/481* (2013.01); *H01L 29/7833* (2013.01); *H01L 2924/0002* (2013.01)

(58) Field of Classification Search
CPC ............ C23C 16/045; C23C 16/45525; H01L 21/28562; H01L 21/32051; H01L 21/7681; H01L 21/76814; H01L 21/76825; H01L 21/76828; H01L 21/76831; H01L 21/76843; H01L 21/76844; H01L 21/76856; H01L 21/76864; H01L 21/76873; H01L 23/5226; H01L 23/53
See application file for complete search history.

(56) References Cited

U.S. PATENT DOCUMENTS

| | | | | |
|---|---|---|---|---|
| 6,528,366 | B1 * | 3/2003 | Tu ............................ | H01L 28/91 257/E21.016 |
| 2001/0041250 | A1 * | 11/2001 | Werkhoven ........... | C23C 16/029 428/212 |
| 2001/0054769 | A1 * | 12/2001 | Raaijmakers ......... | C23C 16/045 257/758 |
| 2011/0227224 | A1 * | 9/2011 | Kitao ................. | H01L 21/76844 257/751 |
| 2011/0318923 | A1 * | 12/2011 | Park ................... | H01L 21/76801 438/675 |
| 2012/0080761 | A1 * | 4/2012 | Hsieh ................ | H01L 21/76898 257/414 |

* cited by examiner

*Primary Examiner* — Fernando L Toledo
*Assistant Examiner* — Lawrence-Linh T Nguyen
(74) *Attorney, Agent, or Firm* — Slater Matsil, LLP

(57) ABSTRACT

A device comprises a via in a substrate comprising a lower via portion with a first width formed of a first conductive material and an upper via portion with a second width greater than the first width, wherein the upper via portion comprises a protection layer formed of the first conductive material and a via fill material portion formed of a second conductive material.

20 Claims, 5 Drawing Sheets

THROUGH VIA STRUCTURE AND METHOD

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, three dimensional integrated circuits have emerged as an effective alternative to further reduce the physical size of a semiconductor chip. In a three dimensional integrated circuit, active circuits such as logic, memory, processor circuits and/or the like are fabricated on different wafers and each wafer die is stacked on top of a packaging component using pick-and-place techniques. Much higher density can be achieved by employing three dimensional integrated circuits. In sum, three dimensional integrated circuits can achieve smaller form factors, cost-effectiveness, increased performance and lower power consumption.

In order to connect electrical circuits in the stacked semiconductor dies, through vias are employed to provide a vertical connection channel through the body of stacked dies. Through vias can be formed by using suitable techniques. For example, in order to form a through via, an opening may be formed on an active side of the semiconductor substrate, wherein the opening extends deeper into the semiconductor substrate than the active devices of the semiconductor substrate. The opening may then be filled with a conductive material such as copper, aluminum, tungsten, silver, gold and/or the like. After the opening has been filled, the backside of the semiconductor substrate may be thinned through a thinning process such as a chemical mechanical polishing process or an etching process. The thinning process is applied to the backside of the substrate until the conductive material of the through via is exposed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
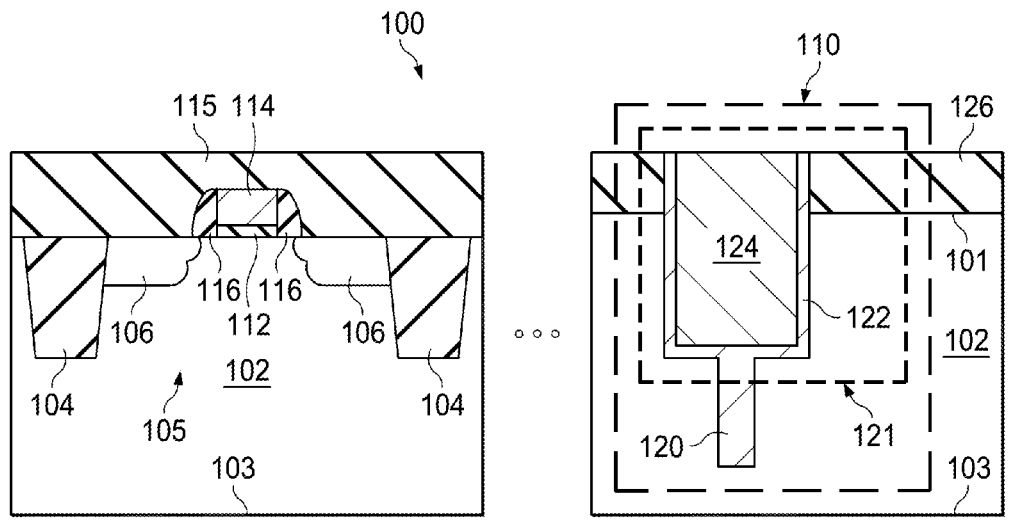
FIG. 1 illustrates a cross sectional view of a semiconductor device in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a cross sectional view of a semiconductor device in accordance with various embodiments of the present disclosure. The semiconductor device 100 is formed in a substrate 102. The substrate 102 has a first side 101 and a second side 103. A plurality of interconnection structures (not shown) may be formed over the first side 101 of the substrate 102.

The semiconductor device 100 may comprise a plurality of transistors and through vias. For simplicity, only one transistor (e.g., transistor 105) and one through via (e.g., through via 110) are shown in FIG. 1. The transistor 105 may be electrically coupled to the through via 110. More particularly, the through via 110 may be coupled to the transistor 105 through a plurality of front side interconnect structures (not shown) formed over the first side 101. Alternatively, the through via 110 may be coupled to the transistor 105 through a plurality of backside interconnect structures (not shown) formed over the second side 103.

The through via 110 may be divided into two portions, namely a lower portion 120 and an upper portion 121. As shown in FIG. 1, the lower portion 120 is adjacent to the second side 103 of the substrate 102. In some embodiments, the lower portion 120 is of a width in a range from about 1 μm to about 6 μm. For example, the lower portion 120 is of a width of about 2 μm. The upper portion 121 is adjacent to the first side 101 of the substrate 102. The upper portion 121 is wider than the lower portion 120 as shown in FIG. 1. In some embodiments, the upper portion 121 is of a width in a range from about 5 μm to about 10 μm.

As shown in FIG. 1, the upper portion 121 may comprise a via fill material portion 124 and a protection layer 122. In some embodiments, the protection layer 122 is formed of a conductive material the same as that of the lower portion 120. In some embodiments, the protection layer 122 and the lower portion 120 may be formed of tungsten, nickel, any combinations thereof and/or the like. The via fill material portion 124 may be formed of copper and/or the like.

The protection layer 122 may function as a barrier layer preventing the conductive material (e.g., copper) of the via fill material portion 124 from diffusing into the surrounding regions. It should be noted that the protection layer 122 shown in FIG. 1 is merely an example, which should not unduly limit the scope of the claims. One of ordinary skill in the art would recognize many variations, alternatives, and modifications. For example, the protection layer 122 may comprise three thin layers formed between the substrate 102 and the via fill material portion 124. In accordance with some embodiments, these three thin layers are a liner layer, a barrier layer and a seed layer respectively.

As shown in FIG. 1, the transistor 105 is formed in the substrate 102. The transistor 105 includes two drain/source regions 106. As shown in FIG. 1, the drain/source regions 106 are formed on opposite sides of a gate stack. The gate stack includes a gate dielectric layer 112 formed over the substrate 102, a gate electrode 114 formed over the gate dielectric layer 112 and gate spacers 116. As shown in FIG. 1, there may be two isolation regions 104 formed on opposite sides of the transistor 105.

The isolation regions 104 may be shallow trench isolation (STI) regions, and may be formed by etching the substrate 102 to form a trench and filling the trench with a dielectric material as is known in the art. For example, the isolation regions 104 may be filled with a dielectric material such as an oxide material, a high-density plasma (HDP) oxide and/or the like. A planarization process such as a chemical mechanical polish (CMP) process may be applied to the top surface so that the excess dielectric material may be removed as a result.

The gate dielectric 112 may be a dielectric material such as silicon oxide, silicon oxynitride, silicon nitride, an oxide, a nitrogen-containing oxide, a combination thereof and/or the like. The gate dielectric 112 may have a relative permittivity value greater than about 4. Other examples of such materials include aluminum oxide, lanthanum oxide, hafnium oxide, zirconium oxide, hafnium oxynitride, combinations thereof and/or the like. In some embodiments in which the gate dielectric 112 comprises an oxide layer, the gate dielectrics 112 may be formed by a plasma-enhanced chemical vapor deposition (PECVD) process using tetraethoxysilane (TEOS) and oxygen as a precursor. In accordance with various embodiments, the gate dielectric 112 may be of a thickness in a range from about 8 Å to about 200 Å.

The gate electrode 114 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof and/or the like. In some embodiments in which the gate electrode 114 is poly-silicon, the gate electrode 114 may be formed by depositing doped or undoped poly-silicon by low-pressure chemical vapor deposition (LPCVD) to a thickness in the range of about 400 Angstroms to about 2,400 Angstroms.

The spacers 116 may be formed by blanket depositing one or more spacer layers (not shown) over the gate electrode 114 and the substrate 102. The spacer layers 116 may comprise suitable dielectric materials such as SiN, oxynitride, SiC, SiON, oxide and/or the like. The spacer layers 116 may be formed by commonly used deposition techniques such as chemical vapor deposition (CVD), PECVD, sputter and/or the like.

The drain/source regions 106 may be formed in the substrate 102 on opposing sides of the gate dielectric 112. In some embodiments in which the substrate 102 is an n-type substrate, the drain/source regions 106 may be formed by implanting appropriate p-type dopants such as boron, gallium, indium and/or the like. Alternatively, in some embodiments in which the substrate 102 is a p-type substrate, the drain/source regions 106 may be formed by implanting appropriate n-type dopants such as phosphorous, arsenic and/or the like.

An interlayer dielectric layer 115 is formed on top of the substrate 102. The interlayer dielectric layer 115 may be formed, for example, of a low-K dielectric material, such as silicon oxide. The interlayer dielectric layer 115 may be formed by any suitable method known in the art, such as spinning, CVD, PECVD and/or the like.

It should also be noted that one skilled in the art will recognize while FIG. 1 illustrates a single interlayer dielectric layer, the interlayer dielectric layer 115 may comprise a plurality of dielectric layers.

FIGS. 2-9 illustrate intermediate steps of fabricating the semiconductor device shown in FIG. 1 in accordance with various embodiments of the present disclosure. It should be noted that the fabrication steps as well as the through silicon via shown in FIGS. 2-9 are merely an example. A person skilled in the art will recognize there may be many alternatives, variations and modifications. For example, the formation processes shown in FIGS. 2-9 may be applicable to forming other through vias such as vias in interconnect structures of a semiconductor device, vias in a molding compound layer of a package-on-package structure, and/or the like.

Figure 2:
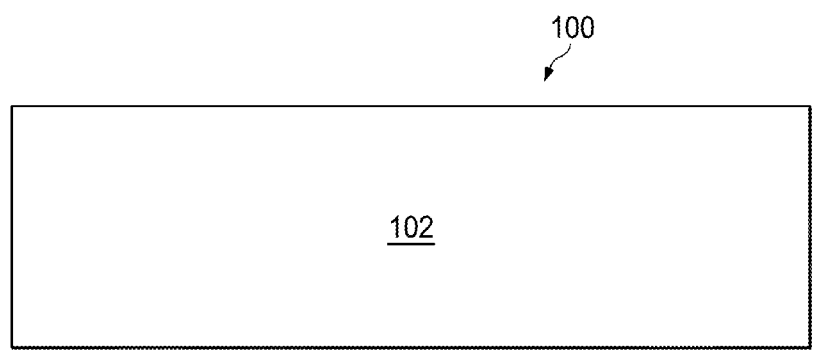
FIG. 2 illustrates a cross sectional view of a substrate in accordance with various embodiments of the present disclosure.

FIG. 2 illustrates a cross sectional view of a substrate in accordance with various embodiments of the present disclosure. The substrate 102 may be formed of silicon, although it may also be formed of other group III, group IV, and/or group V elements, such as silicon, germanium, gallium, arsenic, and combinations thereof.

The substrate 102 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The substrate 102 may further comprise a variety of electrical circuits (not shown). The electrical circuits formed on the substrate 102 may be any type of circuitry suitable for a particular application. In accordance with some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like. The electrical circuits may be interconnected to perform one or more functions. The functions may include memory structures, processing structures, sensors, amplifiers, power distribution, input/output circuitry and/or the like.

Figure 3:
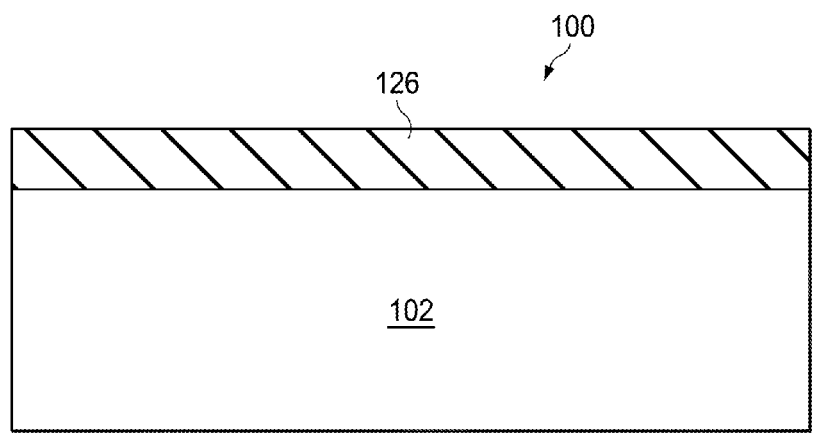
FIG. 3 illustrates a cross sectional view of the semiconductor device shown in FIG. 2 after a mask layer is formed over the substrate in accordance with various embodiments of the present disclosure.

FIG. 3 illustrates a cross sectional view of the semiconductor device shown in FIG. 2 after a mask layer is formed over the substrate in accordance with various embodiments of the present application. The mask layer 126 may function as a hard mask during subsequent photolithography processes. Throughout the description, the mask layer 126 may be alternatively referred to as the hard mask layer 126.

In some embodiments, the hard mask layer 126 may be formed of non-metal materials such as silicon oxide, silicon oxynitride, silicon nitride and/or the like. In alternative embodiments, the hard mask layer 126 may be a metal-hardmask (MHM) layer. The hard mask layer 126 may be formed of titanium nitride (TiN), tantalum nitride (TaN), titanium, tantalum, any combinations thereof and/or the like.

The hard mask layer 126 may be formed by suitable semiconductor fabrication techniques such as CVD and/or the like. The hard mask layer 126 may be of a thickness in a range from about 200 Angstroms to about 1400 Angstroms.

Figure 6:
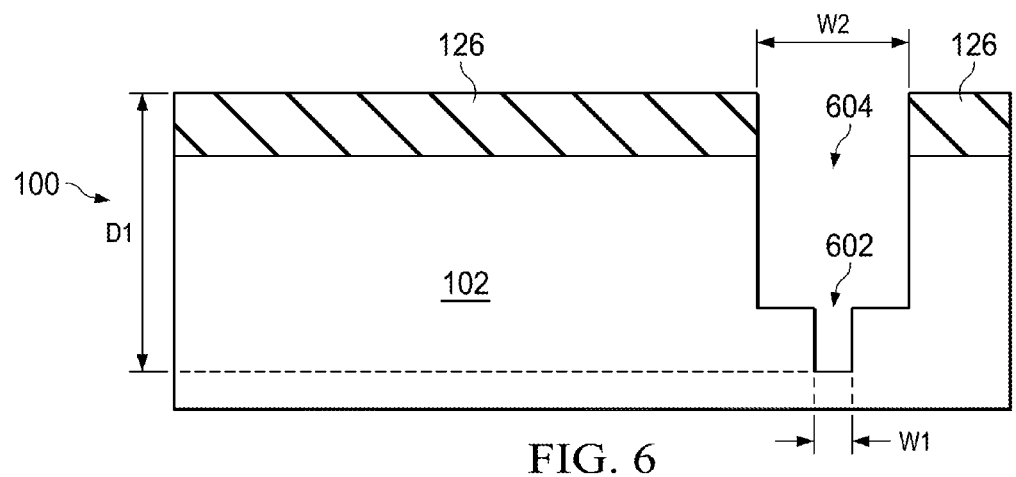
FIG. 6 illustrates a cross sectional view of the semiconductor device shown in FIG. 5 after a trench is formed in the substrate in accordance with various embodiments of the present disclosure.

It should be noted while FIG. 6 illustrates a single hard mask layer 126, one of ordinary skill in the art would recognize many variations, alternatives, and modifications. For example, a multi-layer hard mask, such as layers of silicon dioxide and silicon nitride, may also be used. Furthermore, other materials, such as a metal, a metal nitride, a metal oxide, or the like, may be used.

Figure 4:
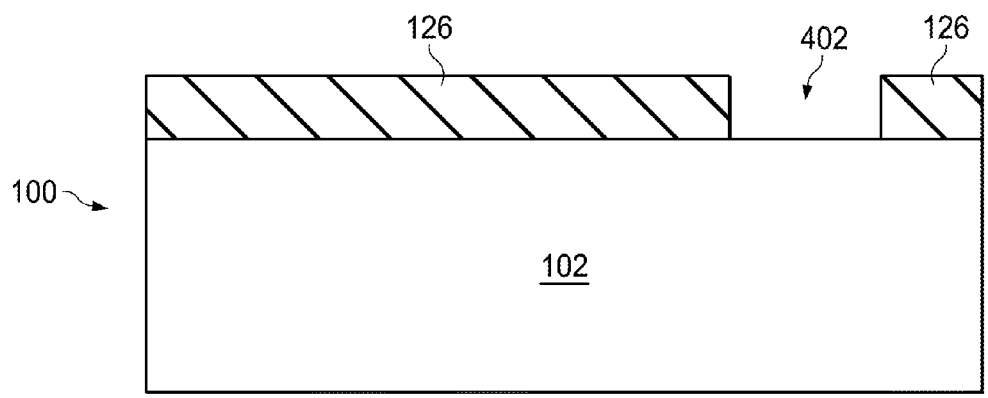
FIG. 4 illustrates a cross sectional view of the semiconductor device shown in FIG. 3 after an opening is formed in the hard mask layer in accordance with various embodiments of the present disclosure.

FIG. 4 illustrates a cross sectional view of the semiconductor device shown in FIG. 3 after an opening is formed in the hard mask layer in accordance with various embodiments of the present disclosure. Prior to forming the opening 402 shown in FIG. 4, a photoresist layer (not shown) may be formed over the hard mask layer 126. A patterning process may be applied to the photoresist layer. In consideration of the location and shape of the upper portion 121 of the through via 110 (shown in FIG. 1), selective areas of the photoresist layer are exposed to light (e.g., positive photoresist), or not exposed to light (e.g., negative photoresist) depending on the nature of the photoresist layer. The patterning process of the photoresist layer involves lithography operations, which are well known, and hence are not discussed in further detail herein.

Once the photoresist layer is patterned, the exposed portion of the hard mask layer 126 may be removed by using a suitable etching process such as wet-etching, dry-etching and/or the like. After the etching process finishes, the opening 402 is formed in the hard mask layer 126 as shown in FIG. 4. The detailed operations of either the dry etching process or the wet etching process are well known in the art, and hence are not discussed herein to avoid unnecessary repetition.

Figure 5:
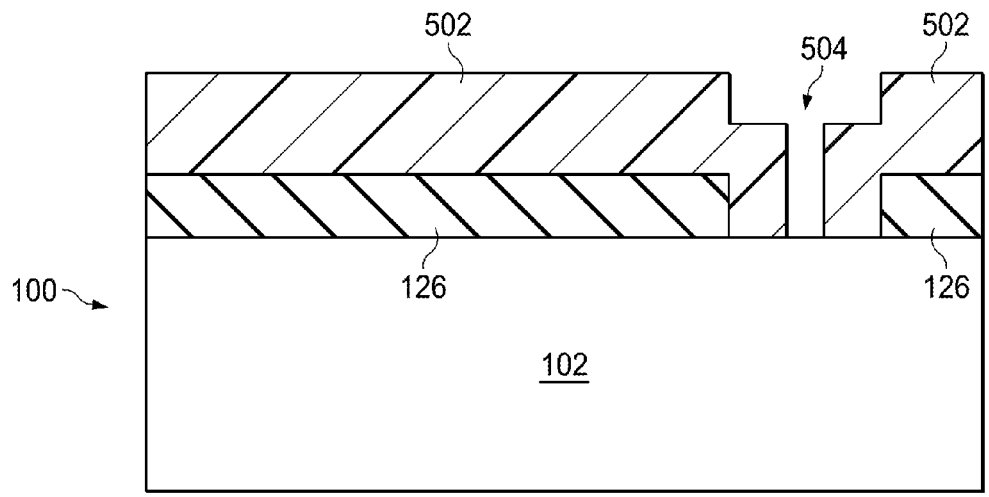
FIG. 5 illustrates a cross sectional view of the semiconductor device shown in FIG. 4 after a photoresist layer is formed over the hard mask layer in accordance with various embodiments of the present disclosure.

FIG. 5 illustrates a cross sectional view of the semiconductor device shown in FIG. 4 after a photoresist layer is formed over the hard mask layer in accordance with various embodiments of the present disclosure. The photoresist layer 502 is deposited over the hard mask layer 126. Since there is an opening in the hard mask layer 126, the top surface of the photoresist layer 502 over the opening is lower than the top surface of the photoresist layer 502 over the hard mask layer 126.

The photoresist layer 502 is patterned according to the shape of the lower portion 120 of the through via 110 (shown in FIG. 1). More particularly, the photoresist layer 502 may be exposed and developed as part of a suitable photolithography process. After the photolithography process finishes, an opening 504 is formed in the photoresist layer 502 as shown in FIG. 5.

FIG. 6 illustrates a cross sectional view of the semiconductor device shown in FIG. 5 after a trench is formed in the substrate in accordance with various embodiments of the present disclosure. The trench 604 may be formed by any suitable semiconductor patterning techniques such as an etching process and/or the like. In some embodiments, the exposed portion (shown in FIG. 5) of the substrate 102 will be removed to form a lower trench 602. Furthermore, during the etching process applied to the substrate 102, the patterned photoresist layer 502 (shown in FIG. 5) will also be etched, although the etch rate of the photoresist material may not be as high as the etch rate of the substrate 102. If the etch process is such that the patterned photoresist layer 502 would be consumed before the etching process is completed, then the hard mask layer 126 may be utilized to form the upper portion of the trench 604 as shown in FIG. 6.

As shown in FIG. 6, the depth of the trench 604 is defined as D1. The width of the lower trench 602 is defined as W1. The width of the upper portion of the trench 604 is defined as W2. In some embodiments, the through via (not shown but illustrated in FIG. 9) formed in the trench 604 is an ultra-high aspect ratio through via. D1 is in a range from about 100 μm to about 300 μm. W1 is about 2 μm. W2 is in a range from about 5 μm to about 10 μm.

Figure 7:
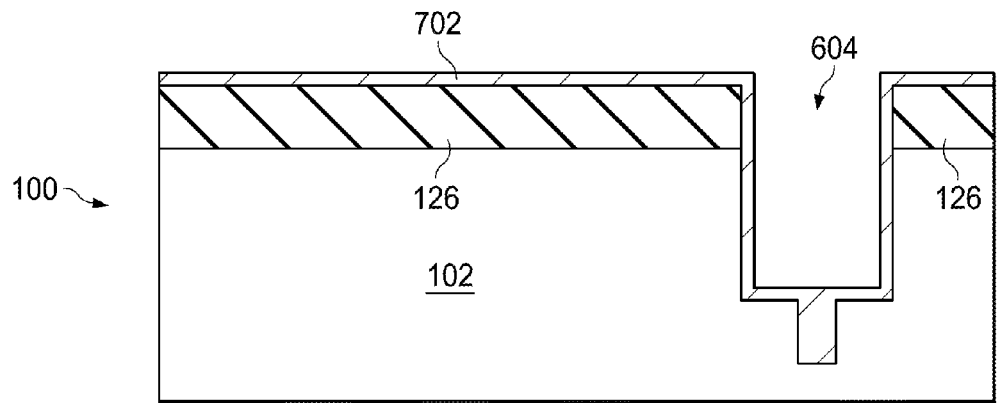
FIG. 7 illustrates a cross sectional view of the semiconductor device shown in FIG. 6 after a barrier layer is formed over the sidewalls and bottom of the trench in accordance with various embodiments of the present disclosure.

FIG. 7 illustrates a cross sectional view of the semiconductor device shown in FIG. 6 after a barrier layer is formed over the sidewalls and bottom of the trench in accordance with various embodiments of the present disclosure. The barrier layer 702 is formed conformally along the sidewalls and bottom of the trench 604. More particularly, the material of the barrier layer 702 fills the lower trench through a pinch-off process. More particularly, the pinch-off process results in closure of the trench 602 (shown in FIG. 6).

The barrier layer 702 may be formed of suitable metal materials such as tungsten, nickel, any combinations thereof and/or the like. The barrier layer 702 may be formed using suitable fabrication techniques such as CVD and/or the like. In some embodiments, the barrier layer 702 is formed of tungsten through a CVD process. During the tungsten CVD process, tungsten conformally grows and fills the bottom of the trench 604 through pinch-off process of the tungsten CVD process. The barrier layer 702 may be of a thickness in a range from about 0.4 µm to about 1 µm.

It should be noted that the thickness of the barrier layer 702 is related to the width of the lower portion 120 of the through via 110 (shown in FIG. 1). More particularly, the material of the barrier layer 702 fills the lower portion 120. The width of the lower portion 120 is approximately equal to two times the thickness of the barrier layer 702. It should further be noted that if there is a liner layer between the barrier layer 702 and the substrate 102, the width of the lower portion 120 is approximately equal to two times the total thickness of the liner layer and the barrier layer 702.

It should be noted a liner layer (not shown) may be formed between the barrier layer 702 and the substrate 102. More particularly, once the trench 604 has been formed within the substrate 102, the sidewalls and the bottom of the trench 604 may be deposited with the liner layer.

The liner layer may be formed of suitable dielectric materials such as TEOS, silicon nitride, oxide, silicon oxynitride, low-K dielectric materials, high-K dielectric materials and/or the like.

The liner layer may be formed using suitable fabrication processes such as a PECVD process, although other suitable processes, such as PVD, a thermal process and/or the like, may alternatively be used. Additionally, the liner layer may be formed to a thickness in a range from about 0.1 µm to about 2 µm.

Furthermore, a seed layer (not shown) may be formed over the barrier layer 702 in accordance with various embodiments. The seed layer may be may be formed of copper, nickel, gold, any combination thereof and/or the like. The seed layer may be formed by suitable deposition techniques such as PVD, CVD and/or the like. The seed layer may have a thickness in a range from about 50 Angstroms to about 1,000 Angstroms.

In addition, the seed layer may be alloyed with a material that improves the adhesive properties of the seed layer so that it can act as an adhesion layer. For example, the seed layer may be alloyed with a suitable material such as manganese, aluminum, any combinations thereof and/or the like, which will migrate to the interface between the seed layer and the barrier layer and will enhance the adhesion between these two layers. The alloying material may be introduced during formation of the seed layer. The alloying material may comprise no more than about 10% of the seed layer.

Figure 8:
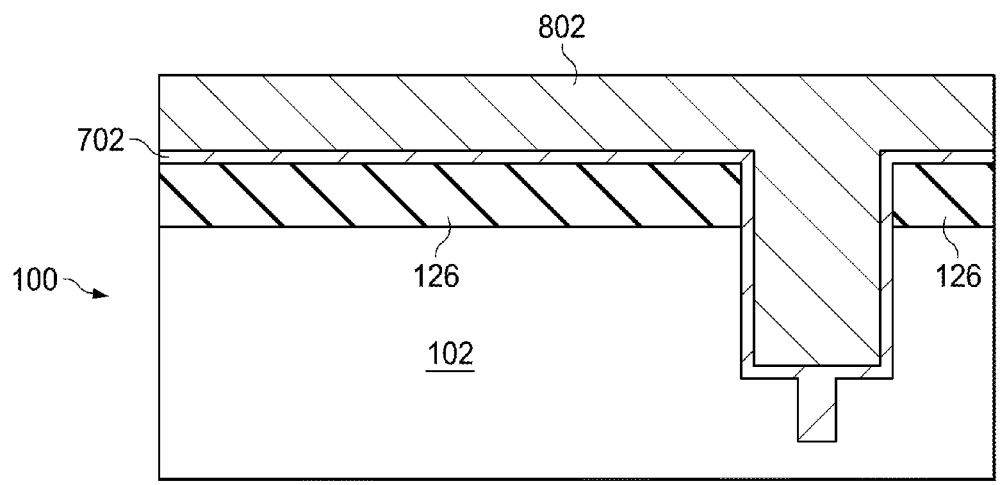
FIG. 8 illustrates a cross sectional view of the semiconductor device shown in FIG. 7 after a conductive material is filled in the trench in accordance with various embodiments of the present disclosure.

FIG. 8 illustrates a cross sectional view of the semiconductor device shown in FIG. 7 after a conductive material is filled in the trench in accordance with various embodiments of the present disclosure. As shown in FIG. 8, the conductive material 802 may be filled in the upper portion of the trench 604 (shown in FIG. 7). The conductive material 802 may be copper, but can be any suitable conductive materials, such as copper alloys, aluminum, tungsten, silver, any combinations thereof and/or the like. The conductive material 802 may be formed by suitable techniques such as electroplating, an electro-less plating process, CVD and/or the like.

Figure 9:
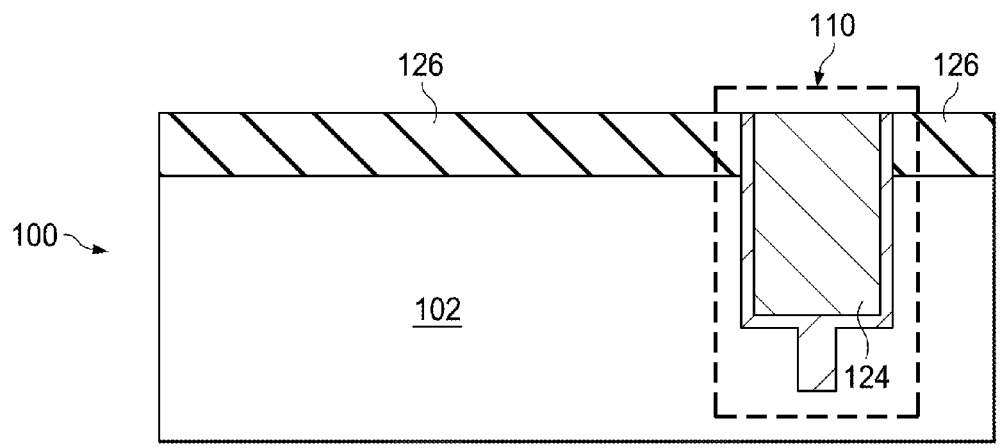
FIG. 9 illustrates a cross sectional view of the semiconductor device shown in FIG. 8 after a planarization process is performed to remove excess conductive materials in accordance with various embodiments of the present disclosure.

FIG. 9 illustrates a cross sectional view of the semiconductor device shown in FIG. 8 after a planarization process is performed to remove excess conductive materials in accordance with various embodiments of the present disclosure. The planarization process may be implemented by using suitable techniques such as grinding, polishing and/or chemical etching, a combination of etching and grinding techniques.

In accordance with various embodiments, the planarization process may be implemented by using a CMP process. In the CMP process, a combination of etching materials and abrading materials are put into contact with the top surface of the semiconductor device and a grinding pad (not shown) is used to grind away excess copper and portions of the barrier layer until the hard mask layer 126 is exposed.

In some embodiments, the through via 110 shown in FIG. 9 may be a high aspect ratio via. According to conventional via formation processes, the reliability of high aspect ratio vias is not good because the conductive material such as copper cannot be plated thoroughly in the trench (e.g., the narrow lower trench). As a result, the copper is not uniformly distributed in the trench. Such a non-uniformity distribution of copper may cause poor electrical characteristics.

The through via 110 shown in FIG. 9 includes two portions. The conductive material of the lower portion is filled through a CVD process (e.g., the CVD process shown in FIG. 7). The conductive material of the upper portion is filled through a plating process (e.g., the plating process shown in FIG. 8). Once the CVD process finishes, the aspect ratio of the through via 110 is reduced.

One advantageous feature of having the formation process shown in FIGS. 2-9 is that the CVD process step shown in FIG. 7 helps to reduce the aspect ratio of the through via 110. The reduced aspect ratio of the through via 110 helps to achieve a uniform distribution of copper during the plating process so as to improve the quality of the plating process shown in FIG. 8.

Figure 10:
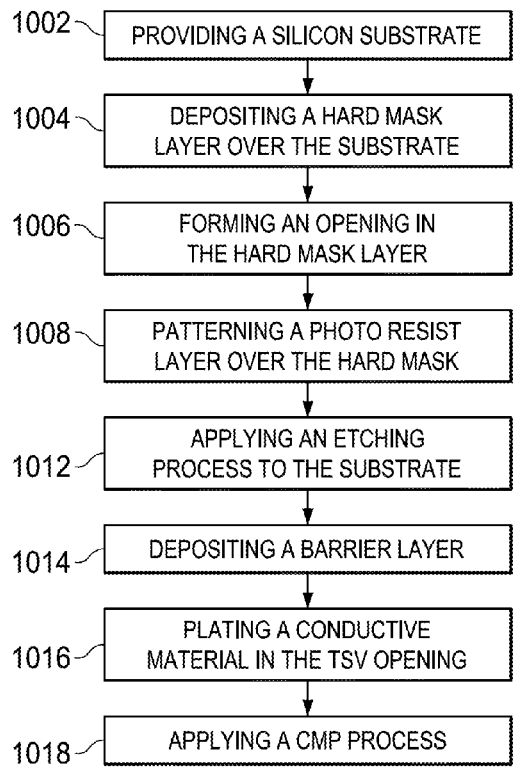
FIG. 10 illustrates a flow chart of a method for forming the semiconductor device shown in FIG. 1 in accordance with various embodiments of the present disclosure.

FIG. 10 illustrates a flow chart of a method for forming the semiconductor device shown in FIG. 1 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 10 may added, removed, replaced, rearranged and repeated.

At step 1002, a substrate is provided. The substrate may comprise a plurality of active circuits. The substrate may be formed of silicon, although it may also be formed of other group III, group IV, and/or group V elements, such as silicon, germanium, gallium, arsenic, and combinations thereof.

At step 1004, a hard mask layer is deposited on the substrate. The hard mask layer may be formed of non-metal materials, metal materials and/or the like. At step 1006, an opening is formed in the hard mask layer according to the shape and location of an upper portion of a through via.

At step 1008, a photoresist layer is formed over the hard mask layer. The photoresist layer is patterned according to a lower portion of the through via. At step 1012, an etching process is applied to the substrate to form a trench in the substrate. The trench includes two portions. A lower portion is of a first width. An upper portion is of a second width. The second width is greater than the first width.

At step 1014, a barrier layer is deposited in the trench. The barrier layer is formed of suitable metals such as tungsten, nickel and/or the like. The metal such as tungsten fills the lower portion of the trench. In addition, the barrier layer is formed on the bottom and sidewalls of the upper portion of the trench.

At step 1016, a conductive material fills the upper portion of the trench through a plating process. In some embodiments, the conductive material is copper. At step 1018, a CMP process is performed to remove excess conductive materials.

Figure 11:
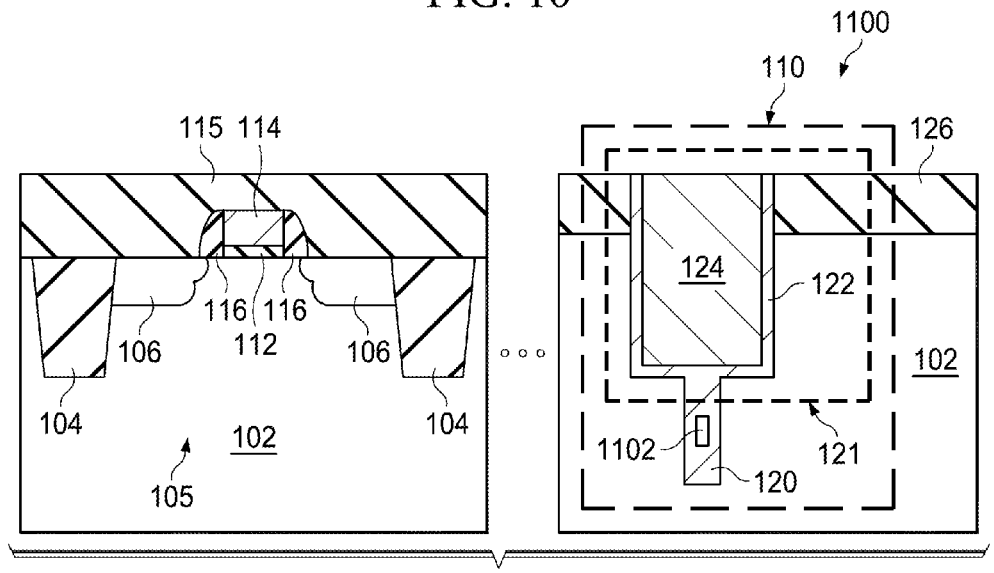
FIG. 11 illustrates a cross sectional view of another semiconductor device in accordance with various embodiments of the present disclosure.

FIG. 11 illustrates a cross sectional view of another semiconductor device in accordance with various embodiments of the present disclosure. The semiconductor device 1100 shown in FIG. 11 is similar to the semiconductor device 100 shown in FIG. 1 except that a seam 1102 is formed in the lower portion 120 of the through via 110.

As described above with respect to FIG. 7, the metal of the lower portion 120 of the through via 110 is deposited into the lower trench through a CVD process. During the CVD process, a pinch-off process may occur. The pinch-off process may generate the seam 1102. As shown in FIG. 11, the seam 1102 is surrounded by the conductive material of the lower trench. The detailed formation processes of the semiconductor device 1100 are similar to those shown in FIGS. 2-9, and hence not discussed again to avoid unnecessary repetition.

Figure 12:
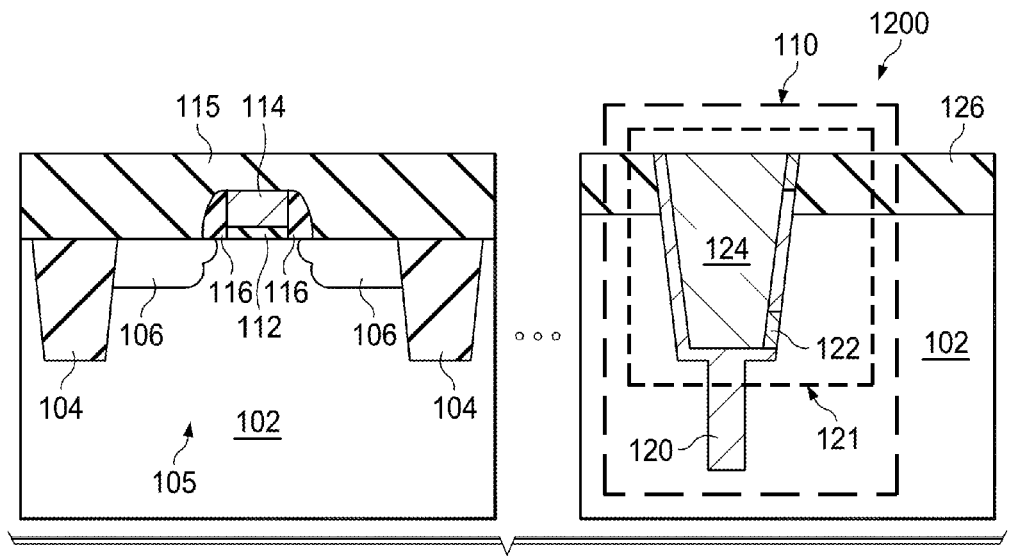
FIG. 12 illustrates a cross sectional view of yet another semiconductor device in accordance with various embodiments of the present disclosure.

FIG. 12 illustrates a cross sectional view of yet another semiconductor device in accordance with various embodiments of the present disclosure. The semiconductor device 1200 shown in FIG. 12 is similar to the semiconductor device 100 shown in FIG. 1 except that the upper portion 121 of the through via 110 is of non-vertical sidewalls as shown in FIG. 12. The through via 110 shown in FIG. 12 is of a taper profile. More particularly, the sidewalls of the upper portion 121 of the through via 110 are not orthogonal to the bottom of the upper portion 121. Instead, the sidewalls of the upper portion 121 are slopes as shown in FIG. 12.

The through via 110 shown in FIG. 12 is a high aspect ratio through via including two portions. The conductive material of the lower portion 120 is filled through a CVD process. During the CVD process, the conductive material such as tungsten builds up until a pinch-off occurs. The pinch-off results in closure of the lower portion 120 of the trench. After the lower portion 120 of the trench is filled with tungsten, the aspect ratio of the trench is reduced during the subsequent plating process applied to the upper portion of the trench. The detailed formation processes of the semiconductor device 1200 are similar to those shown in FIGS. 2-9, and hence not discussed again to avoid unnecessary repetition.

Figure 13:
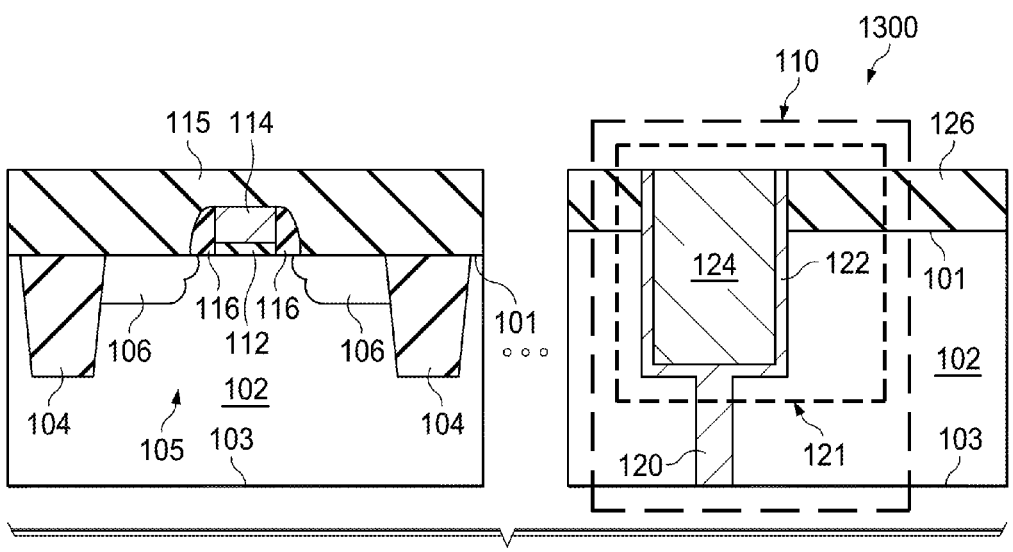
FIG. 13 illustrates a cross sectional view of another semiconductor device in accordance with various embodiments of the present disclosure.

FIG. 13 illustrates a cross sectional view of another semiconductor device in accordance with various embodiments of the present disclosure. The semiconductor device 1300 shown in FIG. 13 is similar to the semiconductor device 100 shown in FIG. 1 except that a thinning process is applied to the backside of the semiconductor device. According to the fabrication processes of through vias, the second side 103 (a.k.a. backside) of the substrate 102 is thinned until the conductive material of the through via 110 is exposed.

The thinning process may be implemented by using suitable techniques such as grinding, polishing and/or chemical etching, a combination of etching and grinding techniques. In accordance with an embodiment, the thinning process may be implemented by using a CMP process. In the CMP process, a combination of etching materials and abrading materials are put into contact with the backside of the substrate and a grinding pad (not shown) is used to grind away the backside of the substrate 102 until the conductive material of the through via 110 is exposed as shown in FIG. 13.

In accordance with an embodiment, a device comprises a via in a substrate comprising a lower via portion with a first width formed of a first conductive material and an upper via portion with a second width greater than the first width, wherein the upper via portion comprises a protection layer formed of the first conductive material and a via fill material portion formed of a second conductive material.

In accordance with an embodiment, a device comprises a substrate comprising a transistor in a first side of the substrate, a via in the substrate comprising a lower portion with a first width formed of a first conductive material, wherein the lower portion is adjacent to a second side of the substrate and an upper portion with a second width greater than the first width, wherein the upper via portion is adjacent to the first side of the substrate and the upper via portion comprises a protection layer formed of the first conductive material and a via fill material portion formed of a second conductive material.

In accordance with an embodiment, a method comprises forming a trench in a substrate, wherein the trench comprises a lower portion with a first width and an upper portion with a second width greater than the first width, depositing a first conductive material in the trench to fill the lower portion and form a protection layer on sidewalls and a bottom of the upper portion and plating a second conductive material to fill the upper portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a via in a substrate, the substrate having active circuits, the via comprising:
   a lower via portion with a first width formed of a first conductive material, wherein the lower via portion extends from a lower surface of the substrate into the substrate; and
   an upper via portion with a second width greater than the first width, wherein the upper via portion extends from the lower via portion to an upper surface of the substrate, and wherein the upper via portion comprises:
   a protection layer formed of the first conductive material; and
   a via fill material portion formed of a second conductive material, and wherein a bottommost surface of the upper via portion is over and in contact with a topmost surface of the lower via portion, and wherein the first conductive material completely fills an interface between the lower via portion and the upper via portion.

2. The device of claim 1, wherein:
   the first conductive material is tungsten; and
   the second conductive material is copper.

3. The device of claim 1, further comprising:
   a void in the lower via portion, wherein the void is surrounded by the first conductive material.

4. The device of claim 1, wherein:
   the upper via portion comprises non-vertical sidewalls.

5. The device of claim 1, wherein:
   the protection layer is a barrier layer between the via fill material portion and the substrate.

6. The device of claim 1, wherein:
the lower via portion is formed of a same material from a first sidewall of the lower via portion to a second sidewall of the lower via portion.

7. The device of claim 6, wherein:
the same material extends from the lower via portion to the protection layer of the upper via portion.

8. A device comprising:
a substrate comprising a transistor in a first side of the substrate, wherein the substrate comprises a first surface and a second surface opposite the first surface;
a via in the substrate, the via comprising:
   a lower portion with a first width formed of a first conductive material, wherein the lower portion extends from the second surface of the substrate toward the first surface of the substrate; and
   an upper portion with a second width greater than the first width, wherein the upper portion extends from the first surface of the substrate to the lower portion of the via, and wherein the upper portion comprises:
      a protection layer formed of the first conductive material, and wherein the protection layer is on a bottom and sidewalls of the upper portion of the via; and
      a via fill material formed of a second conductive material, and wherein a bottommost surface of the protection layer is over and in contact with a topmost surface of the lower portion of the via, wherein the lower portion of the via is free of the via fill material.

9. The device of claim 8, further comprising:
a hard mask layer over the first side of the substrate.

10. The device of claim 9, wherein:
a top surface of the upper portion is substantially level with a top surface of the hard mask layer.

11. The device of claim 10, wherein:
a portion of the upper portion formed by the via fill material and the lower portion are separated by a bottom portion of the protection layer.

12. The device of claim 8, wherein:
the protection layer is a barrier layer on sidewalls and a bottom of the upper portion.

13. The device of claim 8, wherein:
the protection layer comprises tungsten; and
the via fill material is copper.

14. The device of claim 8, wherein:
the lower portion comprises tungsten.

15. A device comprising:
a via in a substrate comprising:
   a lower via portion with a first width formed of a first conductive material, wherein the lower via portion comprises a void surrounded by the first conductive material; and
   an upper via portion with a second width greater than the first width, wherein the upper via portion comprises:
      a protection layer formed of the first conductive material; and
      a via fill material formed of a second conductive material, wherein the lower via portion of the via is free of the via fill material.

16. The device of claim 15, wherein:
the void is rectangular in shape.

17. The device of claim 15, wherein:
the first conductive material is tungsten; and
the second conductive material is copper.

18. The device of claim 15, wherein:
the upper via portion has a non-vertical sidewall.

19. The device of claim 15, wherein:
the upper via portion is of a width in a range from about 5 μm to about 10 μm; and
the lower via portion is of a width of about 2 μm.

20. The device of claim 15, wherein:
the protection layer is on a bottom and sidewalls of the upper via portion.

* * * * *